(12) United States Patent
Otsubo et al.

(10) Patent No.: US 12,016,112 B2
(45) Date of Patent: Jun. 18, 2024

(54) ELECTRONIC MODULE

(71) Applicant: Murata Manufacturing Co., Ltd., Kyoto (JP)

(72) Inventors: Yoshihito Otsubo, Kyoto (JP); Naoya Murakita, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 542 days.

(21) Appl. No.: 17/204,236

(22) Filed: Mar. 17, 2021

(65) Prior Publication Data

US 2021/0204456 A1 Jul. 1, 2021

Related U.S. Application Data

(63) Continuation of application No. PCT/JP2019/039161, filed on Oct. 3, 2019.

(30) Foreign Application Priority Data

Oct. 5, 2018 (JP) .................. 2018-190261

(51) Int. Cl.
*H05K 1/02* (2006.01)
*H01L 23/552* (2006.01)
(Continued)

(52) U.S. Cl.
CPC .......... *H05K 1/0218* (2013.01); *H01L 23/552* (2013.01); *H05K 3/284* (2013.01); *H05K 9/0084* (2013.01); *H05K 2201/10371* (2013.01)

(58) Field of Classification Search
CPC .... H05K 9/0084; H05K 1/0218; H05K 3/284; H01L 23/552
See application file for complete search history.

(56) References Cited

U.S. PATENT DOCUMENTS 7,545,662 B2* 6/2009 Wang .................. H01L 23/5225
365/158
8,012,868 B1* 9/2011 Naval .................. H01L 23/552
257/784
(Continued)

FOREIGN PATENT DOCUMENTS

JP H09116289 A * 2/1997 .......... H05K 1/0218
JP 2013222829 A 10/2013
(Continued)

OTHER PUBLICATIONS

English translation of JP H09116289 A (Year: 1997).*
(Continued)

*Primary Examiner* — Mukundbhai G Patel
(74) *Attorney, Agent, or Firm* — Pearne & Gordon LLP

(57) ABSTRACT

A module is provided with a substrate including a principal surface, a plurality of electronic components arranged on the principal surface, a sealing resin covering the principal surface and the plurality of electronic components, a ground electrode arranged on the principal surface or inside the substrate, a conductive layer covering the sealing resin and electrically connected to the ground electrode, and a magnetic member. The magnetic member includes a magnetic plate member arranged so as to cover at least a part of the sealing resin and a magnetic wall member arranged in a wall shape between any of the plurality of electronic components. The module is further provided with a metal pin or a metal wire provided along the magnetic wall member and connected to the ground electrode.

20 Claims, 8 Drawing Sheets

(51) Int. Cl.
    *H05K 3/28*      (2006.01)
    *H05K 9/00*      (2006.01)

(56) References Cited

U.S. PATENT DOCUMENTS

| | | | |
|---|---|---|---|
| 10,225,964 B2 * | 3/2019 | Smith | ............... H05K 1/18 |
| 2012/0061816 A1 | 3/2012 | Song et al. | |
| 2013/0271928 A1 | 10/2013 | Shimamura et al. | |
| 2017/0179039 A1 * | 6/2017 | Lee | ............... H01L 21/4853 |
| 2017/0301628 A1 | 10/2017 | Kawabata et al. | |
| 2017/0347462 A1 * | 11/2017 | Miwa | ............... H01L 21/561 |
| 2018/0092257 A1 | 3/2018 | Otsubo et al. | |
| 2019/0273312 A1 | 9/2019 | Otsubo | |
| 2019/0363055 A1 | 11/2019 | Yazaki et al. | |

FOREIGN PATENT DOCUMENTS

| | | | |
|---|---|---|---|
| JP | 2017174949 A | 9/2017 |
| WO | 2016181954 A1 | 11/2016 |
| WO | 2018101384 A1 | 6/2018 |
| WO | 2018159290 A1 | 9/2018 |

OTHER PUBLICATIONS

International Search Report issued in Application No. PCT/JP2019/039161, dated Nov. 19, 2019.

Written Opinion issued in Application No. PCT/JP2019/039161, dated Nov. 19, 2019.

* cited by examiner

ELECTRONIC MODULE

CROSS REFERENCE TO RELATED APPLICATIONS

This is a continuation of International Application No. PCT/JP2019/039161 filed on Oct. 3, 2019 which claims priority from Japanese Patent Application No. 2018-190261 filed on Oct. 5, 2018. The contents of these applications are incorporated herein by reference in their entireties.

BACKGROUND

Technical Field

The present disclosure relates to a module.

Background Art

In Japanese Patent Application Laid-Open No. 2013-222829 (Patent Document 1) describes that, in a module in which a plurality of electronic components are arranged, a shielding member containing a metal material is provided so that a mounting surface on which the electronic components are mounted is separated into a plurality of regions.

Patent Document 1: Japanese Patent Application Laid-Open No. 2013-222829

BRIEF SUMMARY

In recent years, in a module for use as a communication device, components constituting circuits of a power supply system as well as components for wireless communication are mounted with high density to meet the demand for size reduction. In this case, as the mounting density of the components in the module increases, it is necessary to strengthen not only an electromagnetic shield for suppressing an influence of an electromagnetic wave but also a magnetic shield, and a shielding structure satisfying both the electromagnetic shield and the magnetic shield is required. The shielding member described in Patent Document 1 is either a "metal member" functioning as the electromagnetic shield or an "electromagnetic wave absorber containing a soft magnetic material" functioning as the magnetic shield and has only one of the functions.

Therefore, the present disclosure provides a module satisfying both an electromagnetic shield and a magnetic shield in a favorable state.

A module according to the present disclosure is provided with a substrate including a principal surface, a plurality of electronic components arranged on the principal surface, a sealing resin covering the principal surface and the plurality of electronic components, a ground electrode arranged on the principal surface or inside the substrate, a conductive layer covering the sealing resin and electrically connected to the ground electrode, and a magnetic member. The magnetic member includes a magnetic plate member arranged so as to cover at least a part of the sealing resin and a magnetic wall member arranged in a wall shape between any of the plurality of electronic components in a state of being connected to the magnetic plate member. The module is further provided with a metal pin or a metal wire provided along the magnetic wall member and connected to the ground electrode.

According to the present disclosure, it is possible to satisfy both an electromagnetic shield and a magnetic shield while securing a mounting area.

DETAILED DESCRIPTION

Figure 1:
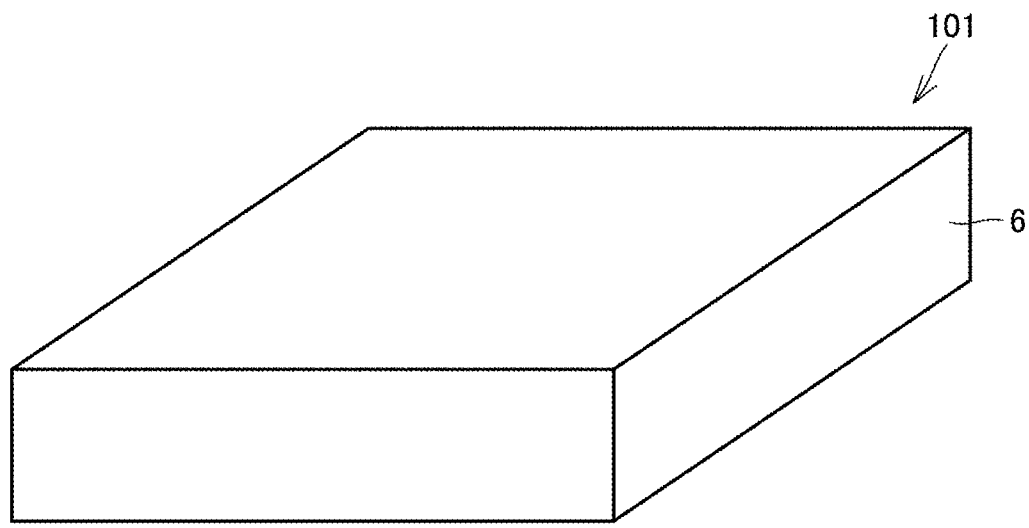
FIG. 1 is a first perspective view of a module according to Embodiment 1 based on the present disclosure.

The dimensional ratios illustrated in the drawings do not necessarily represent an accurate and actual situation, and the dimensional ratios may be exaggerated for convenience of description. In the following description, in a case in which a concept of an upper or lower side is referred to, the upper or lower side does not necessarily mean an absolute upper or lower side and may mean a relative upper or lower side in the illustrated posture.

Embodiment 1

A module according to Embodiment 1 based on the present disclosure will be described with reference to FIGS.

Figure 2:
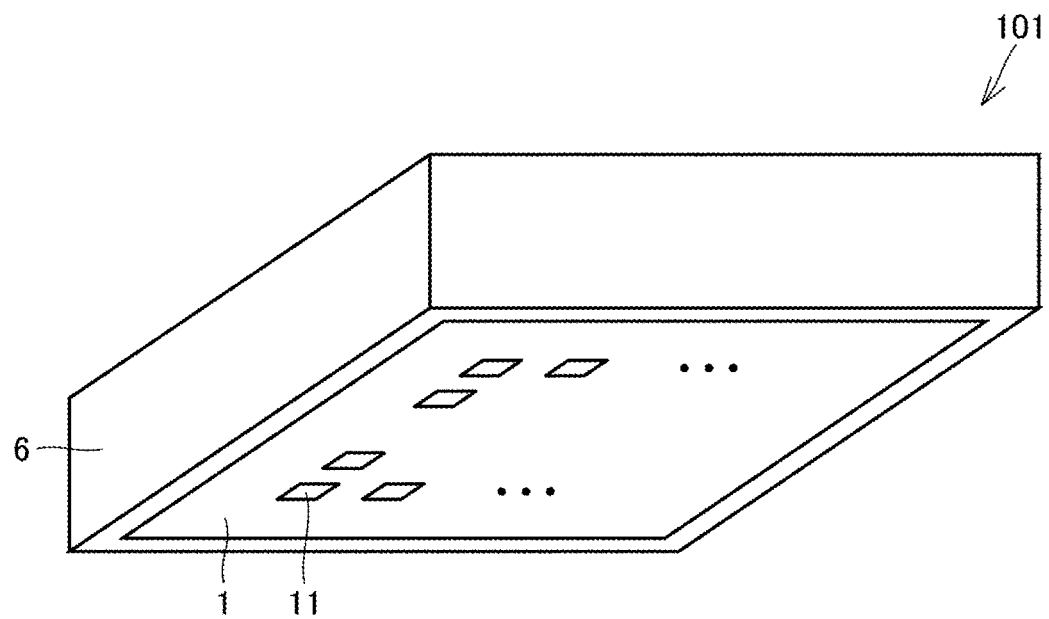
FIG. 2 is a second perspective view of the module according to Embodiment 1 based on the present disclosure.
Figure 3:
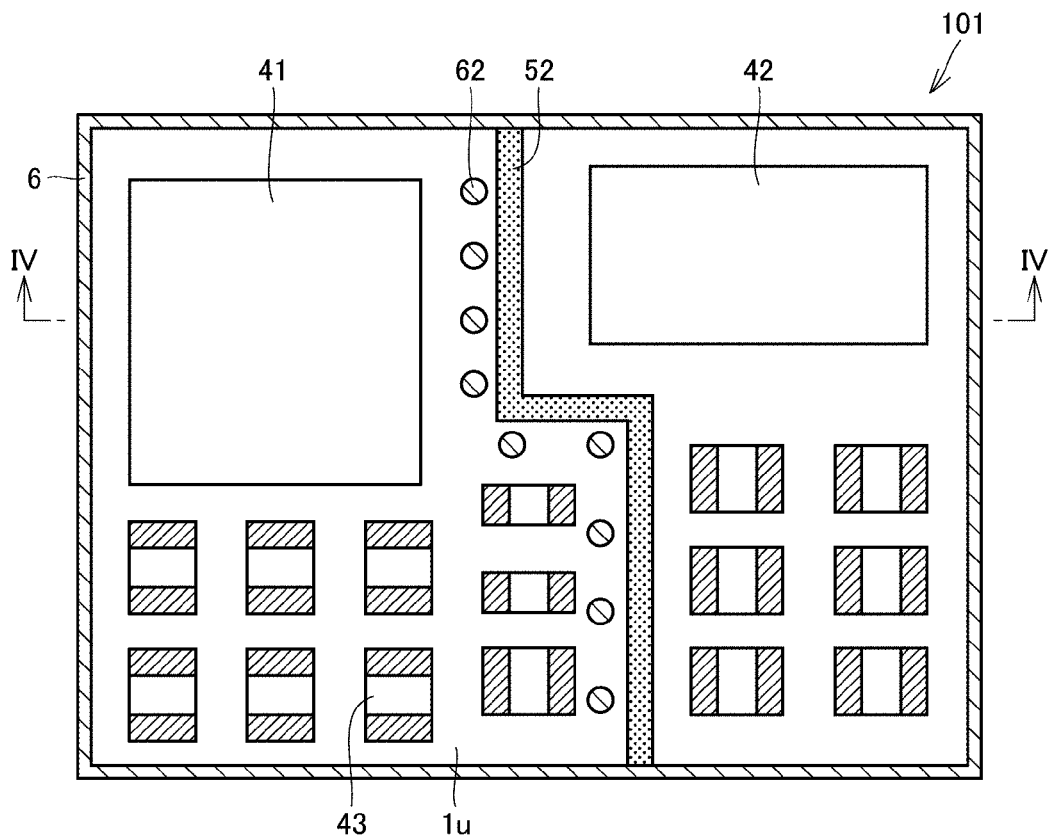
FIG. 3 is a perspective plan view of a module according to Embodiment 1 based on the present disclosure.
Figure 4:
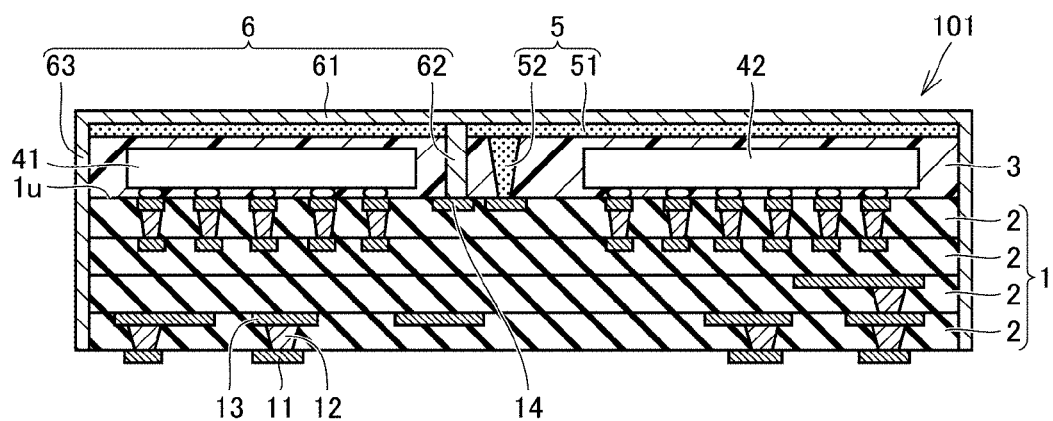
FIG. 4 is a sectional view taken along the line IV-IV in FIG. 3.

1 to 4. An external view of a module 101 according to the present embodiment is illustrated in FIG. 1. An upper surface and a side surface of the module 101 are covered with a conductive layer 6. The module 101 in FIG. 1 as viewed obliquely from a lower side is illustrated in FIG. 2. A lower surface of the module 101 is not covered with the conductive layer 6 and has a substrate 1 exposed therefrom. A lower surface of the substrate 1 is provided with one or more external connection electrodes 11. The number, size, and arrangement of the external connection electrodes 11 illustrated in FIG. 2 are illustrative only. The substrate 1 may be provided with wires on the surface or inside. The substrate 1 may be a resin substrate or a ceramic substrate. The substrate 1 may be a multilayer substrate. A perspective plan view of the module 101 is illustrated in FIG. 3. FIG. 3 corresponds to a view, viewed from an upper side, of a state in which an upper surface of the conductive layer 6 of the module 101 is removed and in which a sealing resin 3 is also removed. A sectional view taken along the line IV-IV in FIG. 3 is illustrated in FIG. 4. FIG. 4 is a sectional view of a state in which the upper surface of the conductive layer 6 and the sealing resin 3 are present. Electronic components 41, 42, and 43 are mounted on a principal surface 1u of the substrate 1. The electronic components 41 and 42 may be integrated circuits (ICs), for example. Each of the external connection electrodes 11 is electrically connected to an internal conductor pattern 13 with a conductor via 12 provided so as to penetrate an insulating layer 2 interposed therebetween.

As illustrated in FIG. 4, the substrate 1 is a lamination of the plurality of insulating layers 2. The configuration of the substrate 1 illustrated here is illustrative only and is not always the case.

The module 101 according to the present embodiment is provided with the substrate 1 including the principal surface 1u, the plurality of electronic components arranged on the principal surface 1u, the sealing resin 3 covering the principal surface 1u and the plurality of electronic components, a ground electrode 14 arranged on the principal surface 1u or inside the substrate 1, the conductive layer 6 covering the sealing resin 3 and electrically connected to the ground electrode 14, and a magnetic member 5. In the present embodiment, the ground electrode 14 is arranged on the principal surface 1u, and a portion 61 of the conductive layer 6 covering the upper surface of the sealing resin 3 is connected to the ground electrode 14 by a plurality of columnar conductors 62 arranged so as to penetrate the sealing resin 3. The conductive layer 6 includes the portion 61, the columnar conductors 62, and a portion 63. The portion 63 covers the side surface of the sealing resin 3 and the side surface of the substrate 1. The magnetic member 5 includes a magnetic plate member 51 arranged so as to cover at least a part of the sealing resin 3 and a magnetic wall member 52 arranged in a wall shape in the sealing resin 3 in a state of being connected to the magnetic plate member 51. The magnetic wall member 52 is arranged in a wall shape between any of the plurality of electronic components. The magnetic wall member 52 may be formed by filling a trench formed in the sealing resin 3 with a magnetic material. The magnetic material to be filled in the trench may be an alloy, such as an Fe—Co-based alloy and an Fe—Ni-based alloy or a ferrite material, such as NiZn and MnZn, for example. Alternatively, the magnetic material may be permalloy plating. The term "permalloy plating" as used herein means plating containing an Ni—Fe alloy. The conductive layer 6 can contain metal. The conductive layer 6 can contain copper, aluminum, gold, or an alloy containing any of these, for example. The module 101 is further provided with a metal pin or a metal wire connected to the ground electrode 14. The metal pin or the metal wire is provided along the magnetic wall member 52. In the present embodiment, the module 101 is provided with the plurality of columnar conductors 62 each serving as an example of "the "metal pin or the metal wire". The plurality of columnar conductors 62 are arranged along the magnetic wall member 52.

In the present embodiment, the conductive layer 6 serves as an electromagnetic shield shielding an electromagnetic wave, and the magnetic member 5 serves as a magnetic shield shielding magnetism. In the present embodiment, it is possible to satisfy both an electromagnetic shield and a magnetic shield while securing a mounting area. Also, the electromagnetic shield can reliably be grounded. Also, since not a wall-shaped conductor but the plurality of columnar conductors are arranged, the electromagnetic shield can be grounded without necessarily causing an unnecessary decrease in component mounting area by providing a continuous land electrode for grounding a member for shielding.

As illustrated in the present embodiment, the magnetic plate member 51 can be interposed between the conductive layer 6 and the sealing resin 3. By employing this configuration, the magnetic plate member 51 can be protected by the conductive layer 6. Since the magnetic plate member 51 is covered with the conductive layer 6, the existence of the magnetic plate member 51 can be prevented from being recognized from the outside. Also, an electromagnetic wave can be shielded more effectively.

In FIG. 4, although a conductor pattern is connected to a lower end of the magnetic wall member 52, the lower end of the magnetic wall member 52 is not required to be connected to a certain conductor pattern. Although the conductive layer 6 can be electrically connected to the ground electrode 14, the magnetic member 5 is not required to be electrically connected to the ground electrode 14. In order to serve as a magnetic shield, the magnetic wall member 52 is not necessarily required to fully separate the sealing resin 3 from the upper end to the lower end of the sealing resin 3 but is merely required to exist as a wall having a certain area. For example, the lower end of the magnetic wall member 52 may be located slightly above the lower end of the sealing resin 3. That is, there may be a gap between the lower end of the magnetic wall member 52 and the principal surface 1u of the substrate 1. The reason for this is that the magnetic material functions as a magnetic shield in a mechanism of absorbing magnetism and converting the magnetism into heat. The conductor pattern arranged immediately below the magnetic wall member 52 in FIG. 4 may not exist.

The distance between the plurality of columnar conductors 62 can be equal to or less than ¼ of the wavelength of an electromagnetic wave that can generate in the module or can arrive in the module.

Meanwhile, the module 101 according to the present embodiment is provided with a metal pin as the metal pin or the metal wire, the ground electrode 14 is arranged on the principal surface 1u, and the portion 61 of the conductive layer 6 covering the upper surface of the sealing resin 3 is connected to the ground electrode by the metal pin. The columnar conductor 62 corresponds to the metal pin.

Embodiment 2

A module according to Embodiment 2 based on the present disclosure will be described with reference to FIG.

5. A module 102 is common to the module 101 described in Embodiment 1 in terms of the basic configuration but differs in the following points.

In the module 102, the conductive layer 6 is interposed between the magnetic plate member 51 and the sealing resin 3.

By employing this configuration, the portion 61 of the conductive layer 6 can be protected by the magnetic plate member 51. Also, an electromagnetic wave from the outside of the module can be shielded more effectively.

(Manufacturing Method)

The module according to the present embodiment can be manufactured in the following manner.

Figure 6:
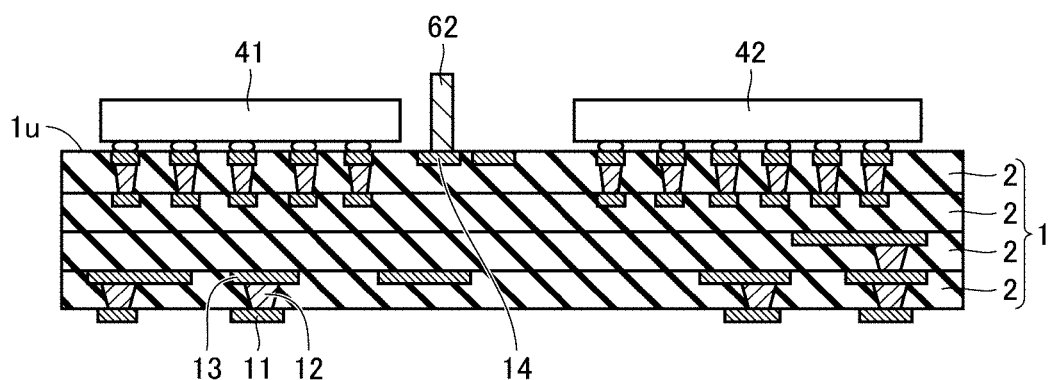
FIG. 6 is an explanatory view of a first process in a method for manufacturing the module according to Embodiment 2 based on the present disclosure.

As illustrated in FIG. 6, the electronic components 41 and 42 are mounted on the principal surface 1u of the substrate 1.

The columnar conductor 62 is arranged on the principal surface 1u. The columnar conductor 62 may be a metal pin, for example. Either the mounting of the electronic components 41 and 42 or the arrangement of the columnar conductor 62 may come first.

Figure 7:
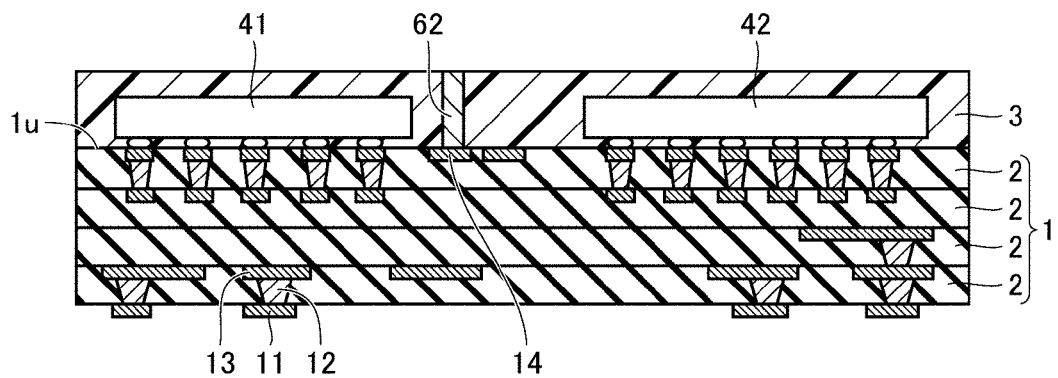
FIG. 7 is an explanatory view of a second process in the method for manufacturing the module according to Embodiment 2 based on the present disclosure.
Figure 8:
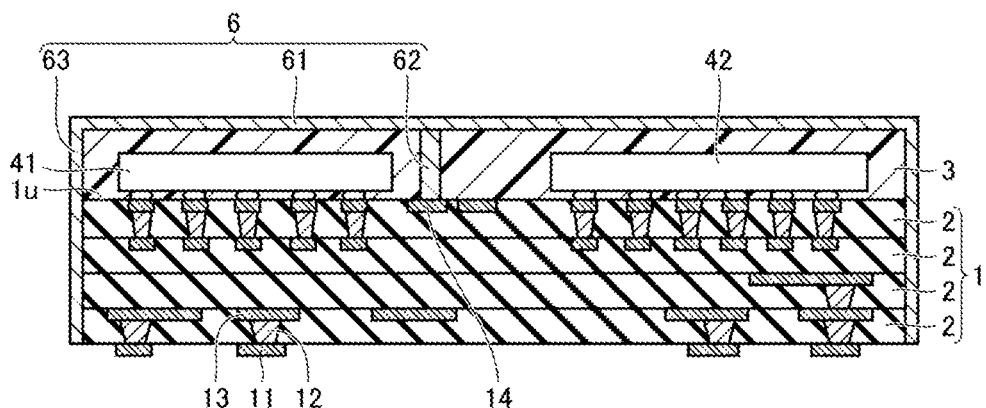
FIG. 8 is an explanatory view of a third process in the method for manufacturing the module according to Embodiment 2 based on the present disclosure.
Figure 9:
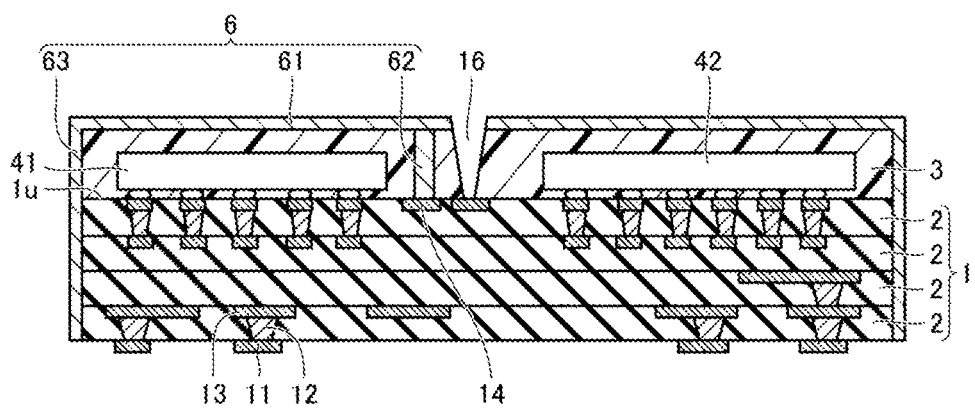
FIG. 9 is an explanatory view of a fourth process in the method for manufacturing the module according to Embodiment 2 based on the present disclosure.

As illustrated in FIG. 7, the electronic components 41 and 42 and the columnar conductor 62 are sealed by the sealing resin 3. The upper surface of the columnar conductor 62 is exposed from the sealing resin 3. The upper surface of the sealing resin 3 is in an equal plane to the upper surface of the columnar conductor 62. As illustrated in FIG. 8, the portion 61 and the portion 63 of the conductive layer are formed. The portion 61 covers the upper surface of the columnar conductor 62 and the upper surface of the sealing resin 3. The portion 61 is electrically connected to the columnar conductor 62. The portion 63 covers the side surface of the sealing resin 3 and the side surface of the substrate 1. In this manner, the portions 61 and 63 and the columnar conductor 62 are combined to cause the conductive layer 6 to be formed. As illustrated in FIG. 9, a trench 16 is formed. To form the trench 16, laser processing may be used, for example.

Figure 5:
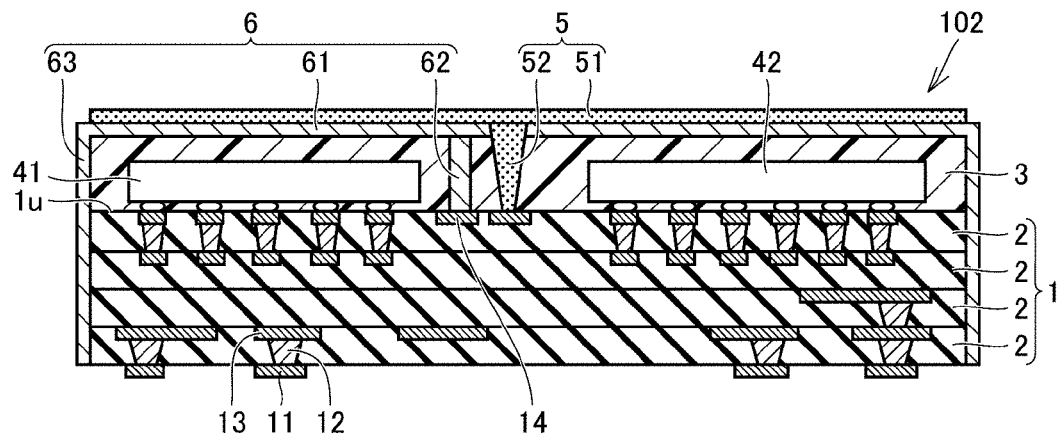
FIG. 5 is a sectional view of a module according to Embodiment 2 based on the present disclosure.
Figure 10:
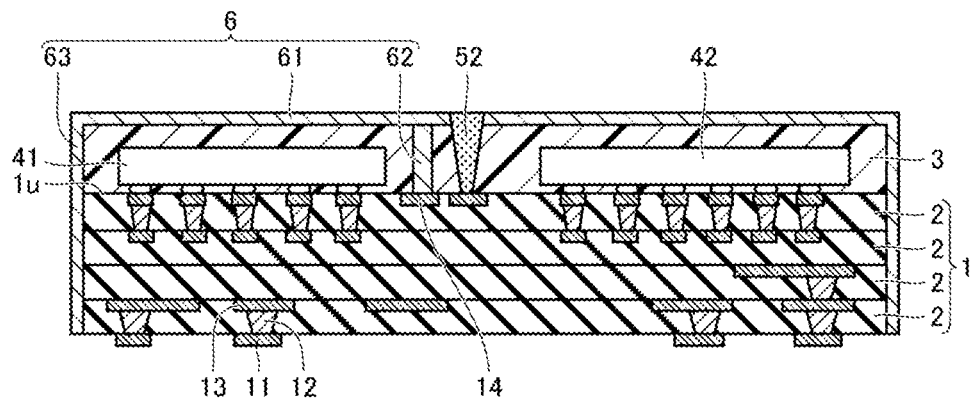
FIG. 10 is an explanatory view of a fifth process in the method for manufacturing the module according to Embodiment 2 based on the present disclosure.

As illustrated in FIG. 10, the trench 16 is filled with a paste of a magnetic material. In this manner, the magnetic wall member 52 is formed. Further, the magnetic plate member 51 is arranged. The magnetic plate member 51 may be formed by applying a paste of a magnetic material or by placing a sheet of a magnetic material. In this manner, the module 102 illustrated in FIG. 5 can be obtained.

Embodiment 3

Figure 11:
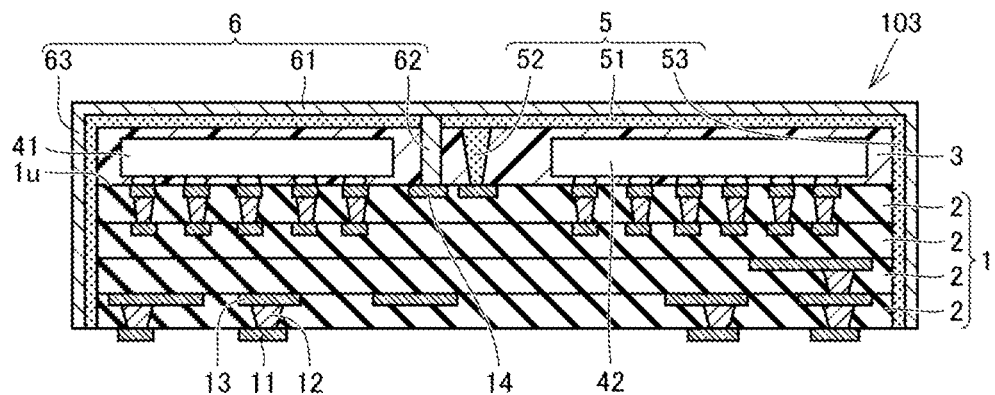
FIG. 11 is a sectional view of a module according to Embodiment 3 based on the present disclosure.

A module according to Embodiment 3 based on the present disclosure will be described with reference to FIG. 11. A module 103 is common to the module 101 described in Embodiment 1 in terms of the basic configuration but differs in the following points.

The magnetic member 5 includes not only the magnetic plate member 51 and the magnetic wall member 52 but also a portion 53 covering the side surface of the sealing resin 3 and the side surface of the substrate 1.

The portion 53 is connected to and integrated with the magnetic plate member 51.

In the present embodiment, since the magnetic member 5 extends to and covers the side surface of the substrate 1, magnetism can be shielded more reliably.

Figure 12:
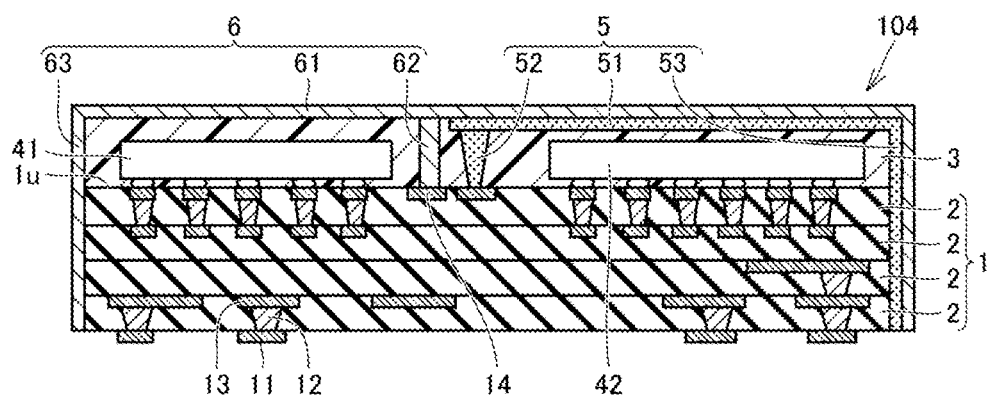
FIG. 12 is a sectional view of a modification example of the module according to Embodiment 3 based on the present disclosure.

As a modification example of the present embodiment, a module 104 illustrated in FIG. 12 may be raised. In the module 104, the magnetic plate member 51 included in the magnetic member 5 does not cover the whole upper surface of the sealing resin 3 but only a part thereof. Here, the magnetic plate member 51 is arranged only in a region corresponding to the electronic component 42. The magnetic plate member 51 covers the electronic component 42 but does not cover the electronic component 41. As for the side surface of the sealing resin 3 and the side surface of the substrate 1, the portion 53 of the magnetic member 5 does not cover the whole periphery but covers only a part on the side on which the electronic component 42 exists.

Embodiment 4

Figure 13:
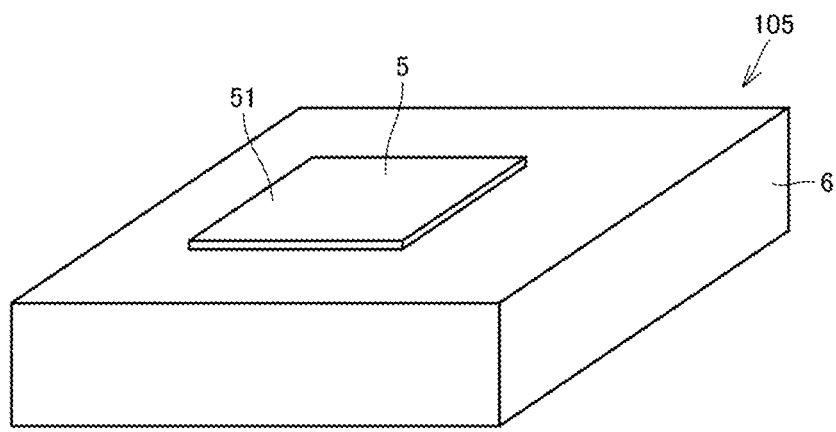
FIG. 13 is a perspective view of a module according to Embodiment 4 based on the present disclosure.
Figure 14:
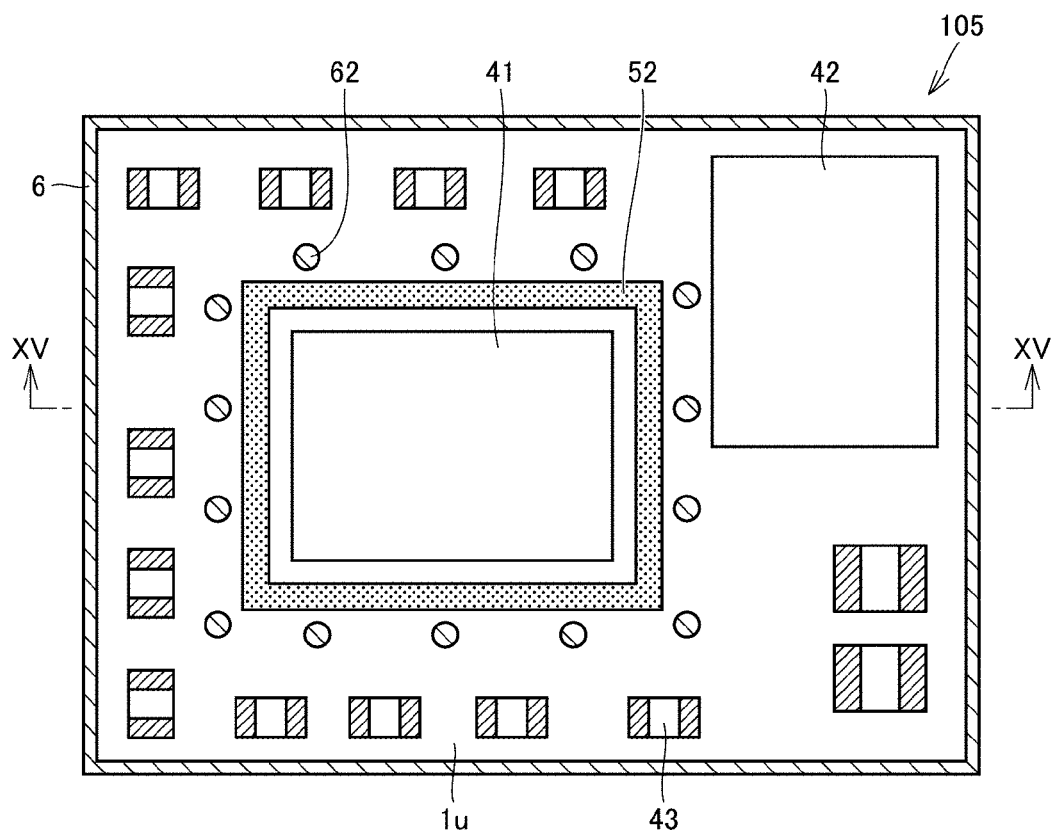
FIG. 14 is a perspective plan view of the module according to Embodiment 4 based on the present disclosure.
Figure 15:
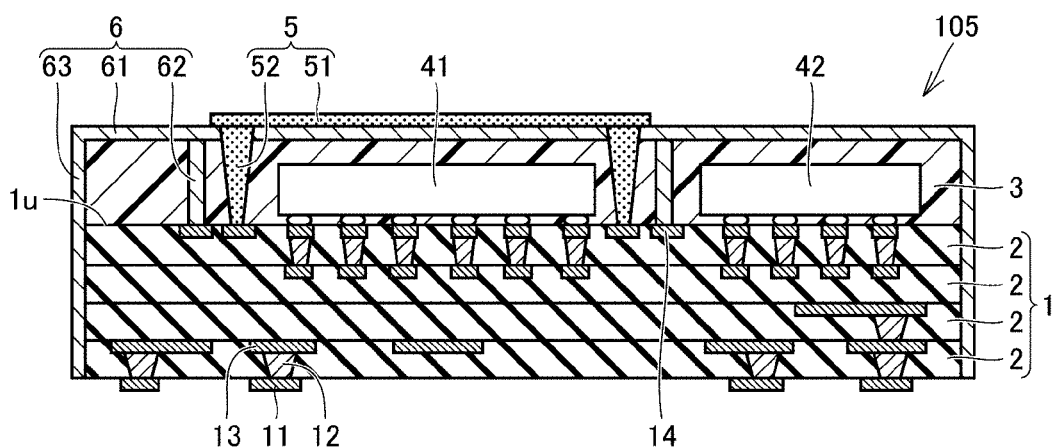
FIG. 15 is a sectional view taken along the line XV-XV in FIG. 14.

A module according to Embodiment 4 based on the present disclosure will be described with reference to FIGS. 13 to 15. An upper surface and a side surface of a module 105 are covered with the conductive layer 6. As illustrated in FIG. 13, a part of the upper surface is covered with the magnetic plate member 51. The magnetic plate member 51 is a part of the magnetic member 5. A perspective plan view of the module 105 is illustrated in FIG. 14. FIG. 14 corresponds to a view, viewed from an upper side, of a state in which an upper surface of the conductive layer 6 of the module 105 is removed and in which the sealing resin 3 is also removed. A sectional view taken along the line XV-XV in FIG. 14 is illustrated in FIG. 15. FIG. 15 is a sectional view of a state in which the upper surface of the conductive layer 6 and the sealing resin 3 are present. The module 105 is common to the module 101 described in Embodiment 1 in terms of the basic configuration but differs in the following points.

In the module 105, the electronic component 41 is mounted on the principal surface 1u. The magnetic wall member 52 surrounds at least one electronic component. Here, as an example, the electronic component 41 is surrounded. The magnetic plate member 51 is arranged in a region corresponding to the electronic component 41. The magnetic plate member 51 covers a part of the portion 61 of the conductive layer 6 covering the upper surface of the sealing resin 3. The magnetic plate member 51 covers a region corresponding to the electronic component 41. The magnetic plate member 51 is slightly larger in size than the electronic component 41. The electronic component 41 is located in a region in which the magnetic plate member 51 is projected onto the principal surface 1u. In a planar view as illustrated in FIG. 14, the electronic component 41 is surrounded by the magnetic wall member 52. The magnetic wall member 52 is arranged in a rectangular shape. Also, a row of the plurality of columnar conductors 62 surrounds the outside of the magnetic wall member 52.

In the present embodiment as well as in Embodiment 1, since the magnetic member 5 extends to and covers the side surface of the substrate 1, magnetism can be shielded more reliably. Also, since the magnetic member 5 covers the electronic component 41, the electronic component 41 can be shielded more reliably.

Figure 16:
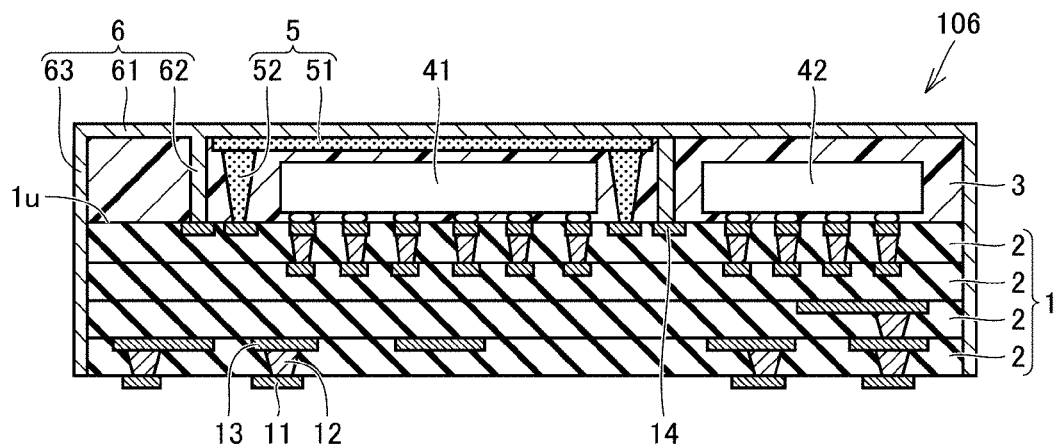
FIG. 16 is a sectional view of a modification example of the module according to Embodiment 4 based on the present disclosure.

As a modification example of the present embodiment, a module 106 illustrated in FIG. 16 may be raised. In the module 106, the magnetic member 5 is covered with the conductive layer 6.

Embodiment 5

Figure 17:
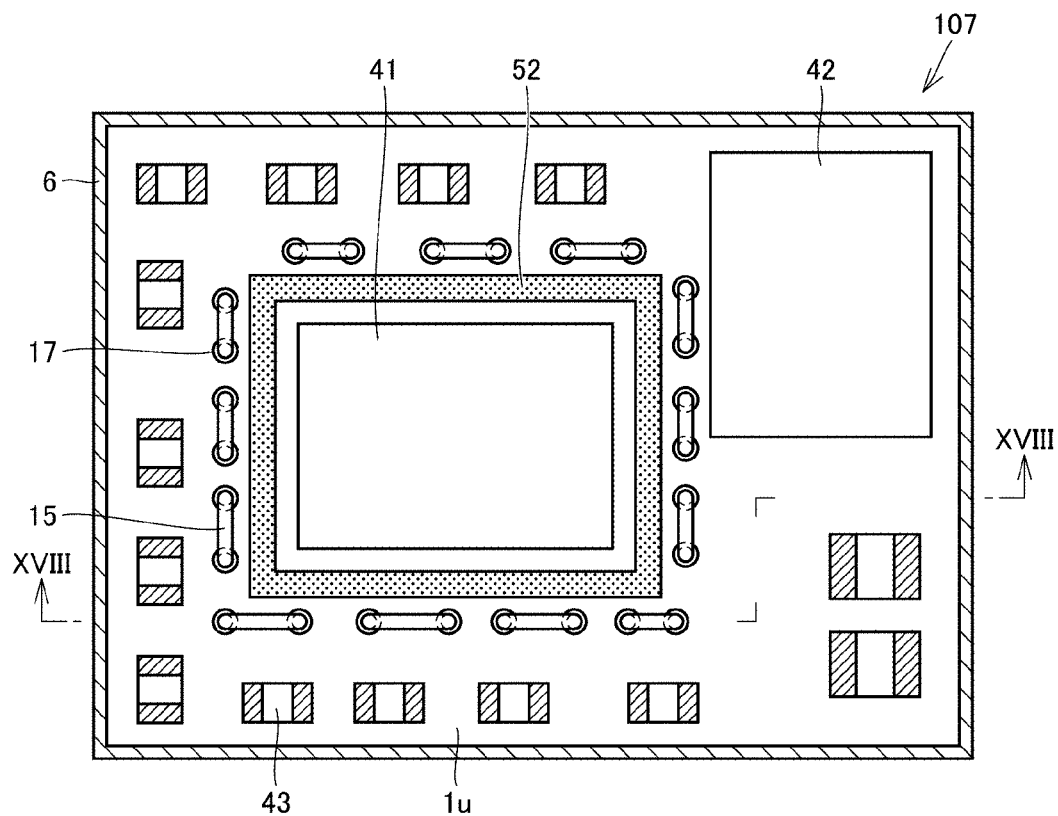
FIG. 17 is a perspective plan view of a module according to Embodiment 5 based on the present disclosure.
Figure 18:
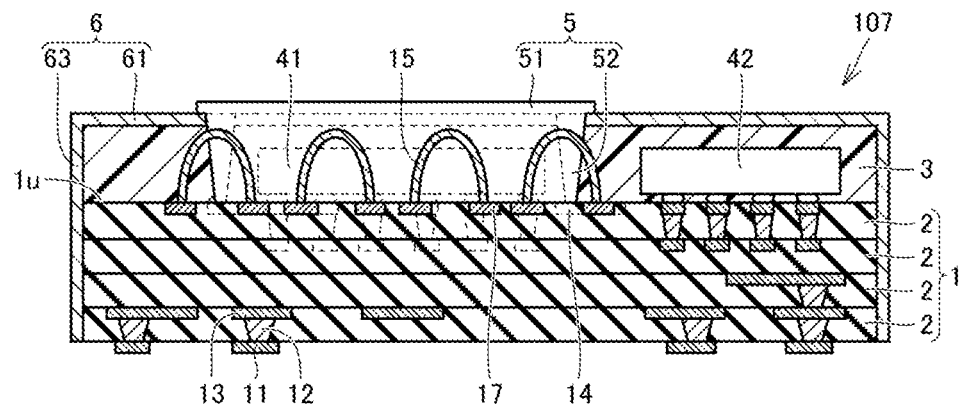
FIG. 18 is a sectional view taken along the line XVIII-XVIII in FIG. 17.

A module according to Embodiment 5 based on the present disclosure will be described with reference to FIGS. 17 to 18. A perspective plan view of a module 107 is illustrated in FIG. 17. FIG. 17 corresponds to a view, viewed from an upper side, of a state in which an upper surface of the conductive layer 6 of the module 107 is removed and in which the sealing resin 3 is also removed. A sectional view taken along the line XVIII-XVIII in FIG. 17 is illustrated in FIG. 18. FIG. 18 is a sectional view of a state in which the upper surface of the conductive layer 6 and the sealing resin 3 are present. The module 107 is common to the module 101 described in Embodiment 1 in terms of the basic configuration but differs in the following points.

The module 107 is provided with a plurality of wires 15 connected to the principal surface 1u. Both ends of each of the plurality of wires 15 are electrically connected to the principal surface 1u and are grounded. As illustrated in FIG. 17, in a case of being viewed in a direction perpendicular to the principal surface 1u, the plurality of wires 15 are arranged along the magnetic wall member 52. As illustrated in FIG. 18, the magnetic plate member 51 covers a part of the portion 61 of the conductive layer 6. That is, the magnetic plate member 51 is further on the upper side than the portion 61.

In the present embodiment, the arrangement of the wires 15 having both the ends thereof connected to the principal surface 1u serves as an electromagnetic shield. In the present embodiment as well, a similar effect to that of Embodiment 1 can be obtained.

Although an example in which the wire 15 is in an inverted U shape is illustrated here, the wire 15 is not necessarily in a regular inverted U shape but may be in an asymmetric inverted U shape. The inverted U-shape formed by the wire 15 may be irregular to some extent. The wire 15 is only required to be looped so that both the ends are connected to the principal surface 1u.

Figure 19:
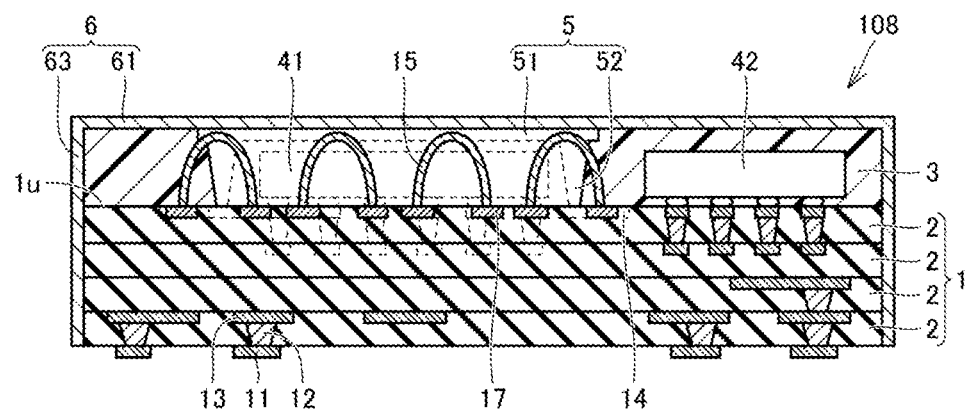
FIG. 19 is a sectional view of a modification example of the module according to Embodiment 5 based on the present disclosure.

As a modification example of the present embodiment, a module 108 illustrated in FIG. 19 may be raised. In the module 108, the magnetic plate member 51 is covered with the portion 61 of the conductive layer 6. That is, the portion 61 is further on the upper side than the magnetic plate member 51. The magnetic member 5 is not exposed to the outside of the conductive layer 6.

Embodiment 6

Figure 20:
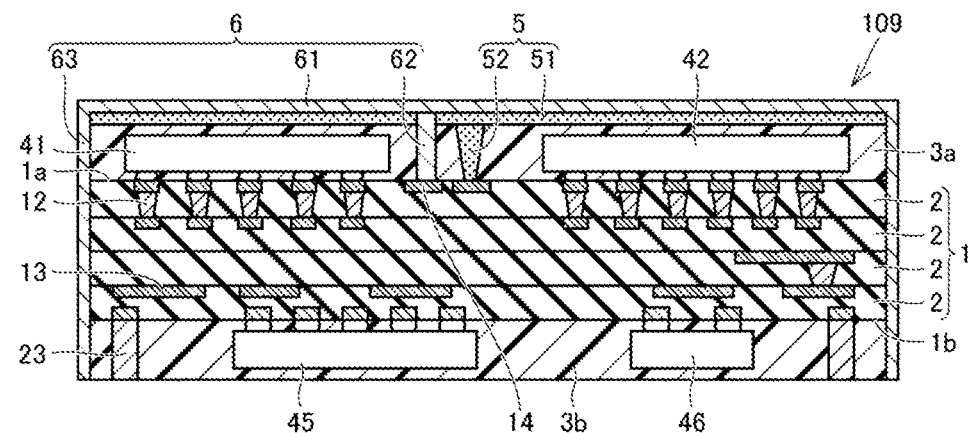
FIG. 20 is a sectional view of a module according to Embodiment 6 based on the present disclosure.

A module according to Embodiment 6 based on the present disclosure will be described with reference to FIG. 20. A sectional view of a module 109 according to the present embodiment is illustrated in FIG. 20. The module 109 according to the present embodiment is similar to the module 101 described in Embodiment 1 in terms of the basic configuration but has the following configuration.

The module 109 has a double-sided mounting structure. That is, in the module 109, the substrate 1 includes a principal surface 1a and a second principal surface 1b as a surface opposite to the principal surface 1a. The module 109 is provided with a second electronic component arranged on the second principal surface 1b. That is, in the module 109, electronic components 45 and 46 are mounted on the second principal surface 1b, for example. As the "second electronic component", at least one electronic component may be arranged. The electronic components 41 and 42 are sealed with a sealing resin 3a. The electronic components 45 and 46 are sealed with a second sealing resin 3b. The electronic components 45 and 46 may be exposed from the second sealing resin 3b. The module 109 is provided with a columnar conductor 23 as an external terminal provided on the second principal surface 1b. The columnar conductor 23 penetrates the second sealing resin 3b. In the example illustrated here, the lower surface of the columnar conductor 23 is exposed to the outside. The columnar conductor 23 may be either a convexity electrode or a metal pin. The columnar conductor 23 may be formed by plating. A solder bump may be connected to the lower end of the columnar conductor 23.

The configuration of the external terminal illustrated here is illustrative only and is not always the case. For example, a solder bump may be used instead of the columnar conductor 23.

Note that some of the above-described embodiments may appropriately be combined and employed. For example, in any of the configurations in Embodiments 2 to 5, a double-sided mounting structure as in Embodiment 6 may be employed.

Note that the embodiments disclosed here are illustrative only and are not limitative in all respects. The scope of the present disclosure is defined by the claims, and the present disclosure includes any modifications within the meaning and scope equivalent to those of the claims.

DESCRIPTION OF REFERENCE SYMBOLS

1: Substrate
1a, 1u: Principal surface
1b: Second principal surface
2: Insulating layer
3, 3a: Sealing resin
3b: Second sealing resin
5: Magnetic member
6: Conductive layer
11: External connection electrode
12: Conductor via
13: Internal conductor pattern
14: Ground electrode
15: Wire
16: Trench
17: Pad electrode
23: Columnar conductor
41, 42, 43, 45, 46: Electronic component
51: Magnetic plate member
52: Magnetic wall member
53: Portion (of magnetic member covering side surface of sealing resin and side surface of substrate)
61: Portion (of conductive layer covering upper surface of sealing resin)
62: Columnar conductor
63: Portion (of conductive layer covering side surface of sealing resin)
101, 102, 103, 104, 105, 106, 107, 108: Module

The invention claimed is:
1. A module comprising:
a substrate including a principal surface;
a plurality of electronic components mounted on the principal surface;
a sealing resin covering the principal surface and the plurality of electronic components;
a ground electrode on the principal surface or inside the substrate;
a conductive layer covering the sealing resin and electrically connected to the ground electrode; and
a magnetic member,
wherein the magnetic member includes:
a magnetic plate member covering at least a part of the sealing resin and the plurality of electronic components mounted on the principal surface,
a magnetic wall member in a wall shape disposed between any of the plurality of electronic components, the magnetic wall member attached to the magnetic plate at a position located between two ends of the magnetic plate, and
a metal pin or a metal wire along the magnetic wall member, the metal pin or the metal wire being connected to the ground electrode.

2. The module according to claim 1, wherein the magnetic plate member is interposed between the conductive layer and the sealing resin.

3. The module according to claim 2, wherein the magnetic wall member surrounds at least one of the plurality of electronic components.

4. The module according to claim 2, wherein
the module comprises the metal pin,
the ground electrode is on the principal surface, and
a portion of the conductive layer covering an upper surface of the sealing resin is connected to the ground electrode by the metal pin.

5. The module according to claim 2, wherein
the module comprises a plurality of the metal wires, and
both ends of each of the plurality of the metal wires are electrically connected to the principal surface and are grounded.

6. The module according to claim 2, wherein the magnetic member contains:
an alloy comprising an Fe—Co-based alloy, or an Fe—Ni-based alloy, or a combination of the Fe—Co-based alloy and the Fe—Ni-based alloy, or
a ferrite material comprising NiZn, or MnZn, or a combination of NiZn and MnZn, or permalloy plating.

7. The module according to claim 1, wherein the conductive layer is interposed between the magnetic plate member and the sealing resin.

8. The module according to claim 7, wherein the magnetic wall member surrounds at least one of the plurality of electronic components.

9. The module according to claim 7, wherein
the module comprises the metal pin,
the ground electrode is on the principal surface, and
a portion of the conductive layer covering an upper surface of the sealing resin is connected to the ground electrode by the metal pin.

10. The module according to claim 7, wherein
the module comprises a plurality of the metal wires, and
both ends of each of the plurality of the metal wires are electrically connected to the principal surface and are grounded.

11. The module according to claim 7, wherein the magnetic member contains:
an alloy comprising an Fe—Co-based alloy, or an Fe—Ni-based alloy, or a combination of the Fe—Co-based alloy and the Fe—Ni-based alloy, or
a ferrite material comprising NiZn, or MnZn, or a combination of NiZn and MnZn, or permalloy plating.

12. The module according to claim 1, wherein the magnetic wall member surrounds at least one of the plurality of electronic components.

13. The module according to claim 12, wherein
the module comprises the metal pin,
the ground electrode is on the principal surface, and
a portion of the conductive layer covering an upper surface of the sealing resin is connected to the ground electrode by the metal pin.

14. The module according to claim 12, wherein
the module comprises a plurality of the metal wires, and
both ends of each of the plurality of the metal wires are electrically connected to the principal surface and are grounded.

15. The module according to claim 12, wherein the magnetic member contains:
an alloy comprising an Fe—Co-based alloy, or an Fe—Ni-based alloy, or a combination of the Fe—Co-based alloy and the Fe—Ni-based alloy, or
a ferrite material comprising NiZn, or MnZn, or a combination of NiZn and MnZn, or permalloy plating.

16. The module according to claim 1, wherein
the module comprises the metal pin,
the ground electrode is on the principal surface, and
a portion of the conductive layer covering an upper surface of the sealing resin is connected to the ground electrode by the metal pin.

17. The module according to claim 16, wherein the magnetic member contains:
an alloy comprising an Fe—Co-based alloy, or an Fe—Ni-based alloy, or a combination of the Fe—Co-based alloy and the Fe—Ni-based alloy, or
a ferrite material comprising NiZn, or MnZn, or a combination of NiZn and MnZn, or permalloy plating.

18. The module according to claim 1, wherein
the module comprises a plurality of the metal wires, and
both ends of each of the plurality of the metal wires are electrically connected to the principal surface and are grounded.

19. The module according to claim 1, wherein the magnetic member contains:
an alloy comprising an Fe—Co-based alloy, or an Fe—Ni-based alloy, or a combination of the Fe—Co-based alloy and the Fe—Ni-based alloy, or
a ferrite material comprising NiZn, or MnZn, or a combination of NiZn and MnZn, or permalloy plating.

20. The module according to claim 1, wherein the substrate further includes a second principal surface as a surface opposite to the principal surface, the module further comprising:
a second electronic component on the second principal surface;
a second sealing resin covering the second principal surface and the second electronic component; and
an external terminal on the second principal surface.

* * * * *